US007612645B2

(12) United States Patent
Yeh et al.

(10) Patent No.: US 7,612,645 B2
(45) Date of Patent: Nov. 3, 2009

(54) INTEGRATED INDUCTOR

(75) Inventors: Ta-Hsun Yeh, Hsin-Chu (TW);
Yuh-Sheng Jean, Yun-Lin Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/548,687

(22) Filed: Oct. 11, 2006

(65) Prior Publication Data
US 2007/0126543 A1    Jun. 7, 2007

(30) Foreign Application Priority Data
Oct. 12, 2005   (TW) .............................. 94135491 A

(51) Int. Cl.
*H01F 5/00*    (2006.01)
(52) U.S. Cl. ..................................... 336/200
(58) Field of Classification Search .................. 336/65, 336/83, 200, 232; 257/531
See application file for complete search history.

(56) References Cited
U.S. PATENT DOCUMENTS
5,545,916 A    8/1996   Koullias 6,566,731 B2 *  5/2003  Ahn et al. .................... 257/531
2001/0028098 A1 * 10/2001 Liou ........................... 257/531
2002/0008301 A1 *  1/2002  Liou et al. ................... 257/531
2005/0093668 A1 *  5/2005  Bueyuektas et al. .......... 336/200
2005/0124131 A1 *  6/2005  Hweing et al. ............... 438/381
2006/0125589 A1 *  6/2006  Tamata et al. ............... 336/200
2006/0158302 A1 *  7/2006  Jeong et al. .................. 336/232

FOREIGN PATENT DOCUMENTS
JP          9162354       6/1997
JP          2004119489    4/2004
JP          2005210121    8/2005
KR          2005-0032009  4/2005

OTHER PUBLICATIONS
Chinese language office action. No Date.
English language translation of abstract of JP 2004119489.
English language translation of abstract of JP 2005210121.
English language translation of abstract of JP 9162354. Jun. 20, 1997.

* cited by examiner

*Primary Examiner*—Tuyen Nguyen
(74) *Attorney, Agent, or Firm*—Thomas, Kayden, Horstemeyer & Risley

(57) ABSTRACT

An integrated inductor formed on a substrate comprises a metal layer pattern, a via layer pattern overlapping and electrically connected to the metal layer, and a redistribution layer pattern overlapping and electrically connected to the via layer. The metal layer pattern, the via layer pattern, and the redistribution layer pattern are a coil pattern.

37 Claims, 2 Drawing Sheets

INTEGRATED INDUCTOR

BACKGROUND OF THE INVENTION

1. Field of the Invention

The present invention generally relates to integrated circuit technology, and more particularly, to an integrated inductor structure.

2. Description of the Prior Art

Inductors are broadly applied in electrical circuits, such as transformers, power converters, radio frequency (RF) circuits, and microwave circuits. A major trend of circuit design is to incorporate as many circuit components into integrated circuit form as possible, whereby fabricating costs of the entire circuitry can be minimized. In general, so-called integrated inductors may be fabricated by CMOS standard process, for example logic baseline process, or other special processes, such as RF baseline process. Each process has its own advantages and disadvantages.

Because integrated inductors fabricated by logical baseline process use the same process as other portions of the circuit, and the cost of logic baseline process is relatively low, the total circuit fabrication costs can be lowered. However, metal layers used for realizing inductor coil patterns have limited thickness. (Take 0.13 μm CMOS logic baseline process as an example, wherein the top metal layer has a thickness of approximately 8-10 k Å.) Such a limited thickness may result in excessive resistance. Moreover, the parasitic capacitance is difficult to reduce, which leads to inductors having a low Q factor that affects the efficiency of the inductor, especially in high-speed RF applications. On the other hand, integrated inductors fabricated by a special process such as RF baseline process, may substantially decrease resistance due to much thicker metal layer that can be used for fabricating inductor coil patterns. (Take 0.13 μm RF baseline process as an example, wherein the top metal layer has a thickness of more than 20 k Å, and can even be as high as 30 k Å.), which in turn may result in inductors having a better Q factor and a larger inductance. However, special processes are more complicated and often require more photoresist layers. For these reasons, the entire circuit may have a higher fabrication cost.

SUMMARY OF THE INVENTION

Therefore, one of an objective of the present invention is to provide an integrated inductor with simple process, low cost, and high Q factor.

According to the claimed invention, an integrated inductor is provided. The integrated inductor formed in an integrated circuit comprises a metal layer pattern, a redistribution layer pattern formed above the metal layer pattern, and a via layer pattern formed between the metal layer pattern and the redistribution layer pattern. The via layer electrically conductively contacts the metal layer pattern and the redistribution layer pattern.

The present invention further provides an integrated inductor formed in an integrated circuit. The integrated inductor comprises a substrate, a first metal layer pattern formed above the substrate, and a second metal pattern formed above the first metal pattern electrically conductively contacting the first metal pattern. The integrated inductor comprising the first metal layer pattern and the second metal layer pattern provides a substantial inductance. The first metal layer pattern and the second metal layer pattern are made of different metal materials.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention may be better understood with reference to the accompanying figures in which.

DETAILED DESCRIPTION

Figure 1:
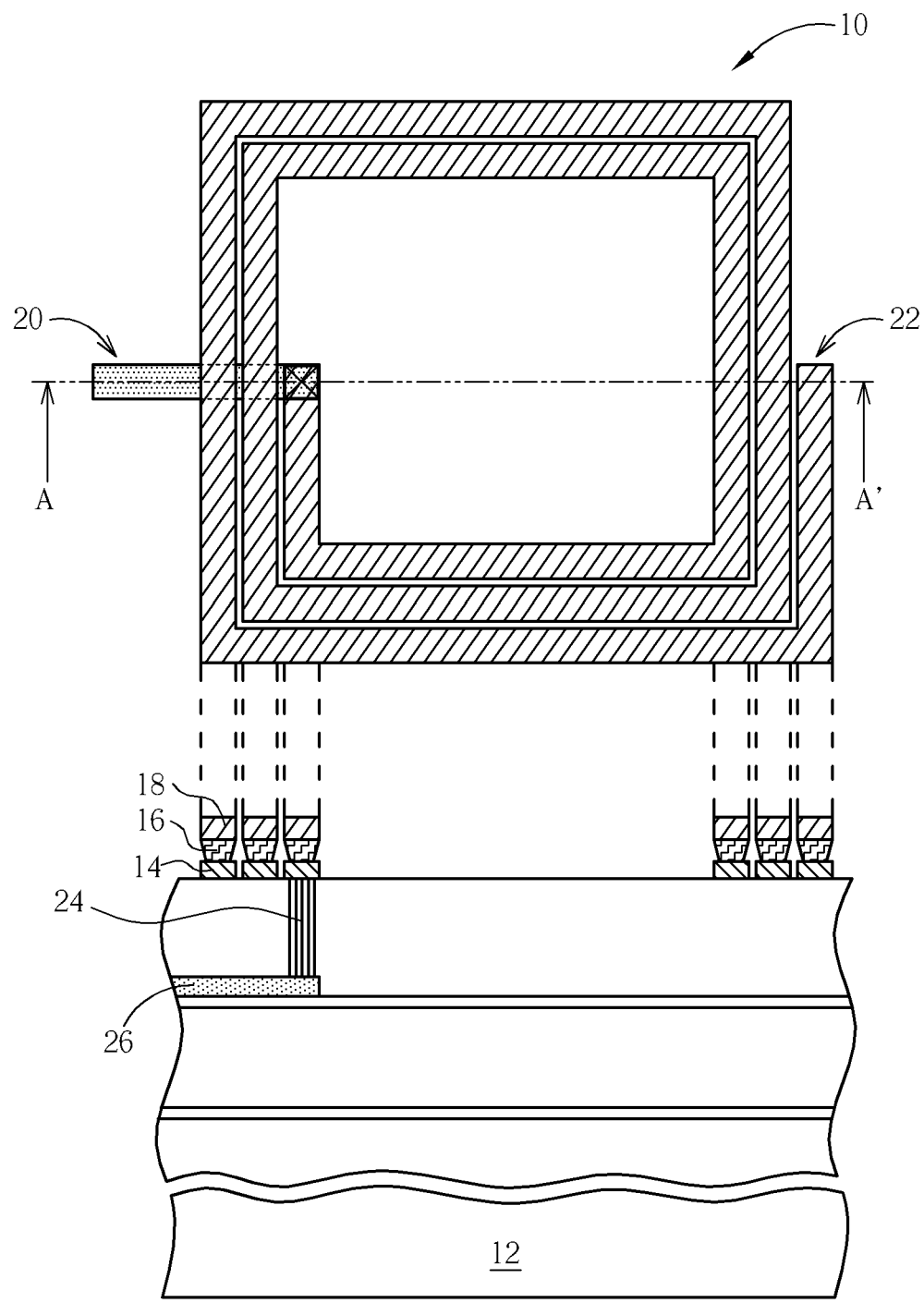
FIG. 1 illustrates an embodiment of the integrated inductor according to the present invention.

Please refer to FIG. 1. FIG. 1 is a diagram illustrating an integrated inductor 10 according to an embodiment of the present invention. The diagram includes a top view and a cross-sectional view along a line AA'. Referring to the top view, the integrated inductor 10 is formed as a layout pattern of an integrated circuit, and more particularly, a rectangular-shaped coil pattern with 2.5 turns. Two coil ends of the integrated inductor 10 are labeled terminals 20 and 22, which connect to other components of the circuitry. Terminal 20 is located at the inner side of the coil and usually connects to other components of the circuit through a via plug and a metal layer on a different layer. In the cross-sectional view of FIG. 1, the coil of the integrated inductor is composed of a top metal layer 14, a via layer 16, and a redistribution layer (RDL) 18, which are subsequently stacked on top of one another and are often-seen layers in semiconductor manufacturing processes. As shown in the cross-sectional view and described earlier, the terminal 20 connects to other portions of the circuitry through a via plug 24 and a lower metal layer 26, here the next lower layer right under the top metal layer. The above-mentioned top metal layer 14, via layer 16, redistribution layer 18, and even the lower metal layer 26 of the integrated circuit structure are all formed on a substrate 12.

Those skilled in the art will understand that, although the integrated inductor 10 of the present embodiment is realized in the form of a rectangular-shaped coil pattern, the integrated inductor can also be formed as a spiral-shaped coil pattern, or any other known or novel pattern, and the shape or pattern in which the inductor is realized is not meant to be limiting.

The following example assumes a UMC 0.13 μm CMOS standard process, or logic baseline process. In the embodiment of FIG. 1, the top metal layer (Mtop) 14 comprises copper and has a thickness of approximately 8-kilo angstrom (k Å). The ratio of width to thickness is 10 to 1, but other ratios are also possible. The via layer 16 comprises aluminum and has a thickness of approximately 11 k Å. The redistribution layer comprises aluminum and has a thickness of 12 k Å. Here it is to be noted that one of ordinary skill in the art would readily recognize that in ordinary manufacturing process applications the redistribution layer 18 functions as a dielectric medium formed on top of a bond pad structure, to avoid exposure of the copper of the metal layer. In the embodiment, the redistribution layer 18, originally formed on the bond pad structure, is formed as a portion of the integrated inductor. Additionally, according to a general design rule of integrated circuit layout, the choice of pattern in the via layer 16 is strictly limited. For instance, a via layer pattern can only comprises square metal island structures each having a length and width confined to a particular size, and a distance between islands is also fixed. Otherwise, it becomes a violation of design rules. In this embodiment, the layout of the via layer 16 is formed intentionally ignoring the general design rule, such that the via layer 16 connecting the top metal layer 14 and the redistribution layer 18 has the same continuous coil pattern as the top metal layer 14 and the redistribution layer 18.

According to the embodiment of the present invention, the integrated inductor 10 is composed of an 8 k Å thick copper top metal layer 14, an 11 k Å thick aluminum metal layer 16, and a 12 k Å aluminum redistribution layer 18, in stack form. Thus, the thickness of the total metal layer becomes considerably large. (Here, the total thickness is 8 k Å of copper, 11 k Å of aluminum, and 12 k Å of aluminum.) This increases the conducting cross section area of the integrated inductor 10 and consequently decreases the parasitic resistance substantially. Viewed from another perspective, the present invention may be regarded as three layers of parasitic resistance connected in parallel, which substantially decreases the equivalent resistance. Therefore, even without using expensive special process (e.g., RF process), the integrated inductor 10 fabricated by CMOS standard process, or logical baseline process, can still reduce parasitic resistance to the minimum. Moreover, because the integrated inductor 10 is formed by the top-most metal layer 14 and the metal materials even above it, the distance between the integrated inductor 10 and the substrate 12 can be maximized as much as possible. This may decrease the parasitic capacitance and increase the Q factor of the integrated inductor 10.

Though the via layer 16 of this embodiment is formed intentionally ignoring the design rule and has the same pattern as the top metal layer 14 and the redistribution layer 18, this is not meant to serve as an limitation of the present invention. Even when the via layer 16 is formed following the design rule to be a plurality of metal islands scattered between the top metal layer 14 and the redistribution layer 18, it may still result in the same effect, though not as significant due to a reduced parasitic resistance. In addition, the present embodiment is not limited to be fabricated by a UMC 0.13 μm CMOS standard process, or logical baseline process. The present embodiment can also be realized with processes provided by other manufacturers, such as TSMC or SMIC, to achieve the same result. In general, for a 0.13 μm CMOS standard process the top metal layer has a thickness of approximately between 8 k Å and 10 k Å, the redistribution layer (or other metal material layers above the top metal layer) has a thickness of approximately between 11 k Å and 13 k Å, and the via layer between the above-mentioned layers has a thickness of approximately 10 to 12 k Å. Of course, the technique described in the present invention is not limited to the 0.13 μm CMOS standard process. Processes with dimensions larger or smaller than 0.13 μm may be also used. However, along with the reduced dimensions of more advanced future process technology (such as 90 nm, 65 nm, 45 nm, or even smaller) and the increased demands for inductors having better quality, the advantages of the present technology may become more apparent.

Figure 2:
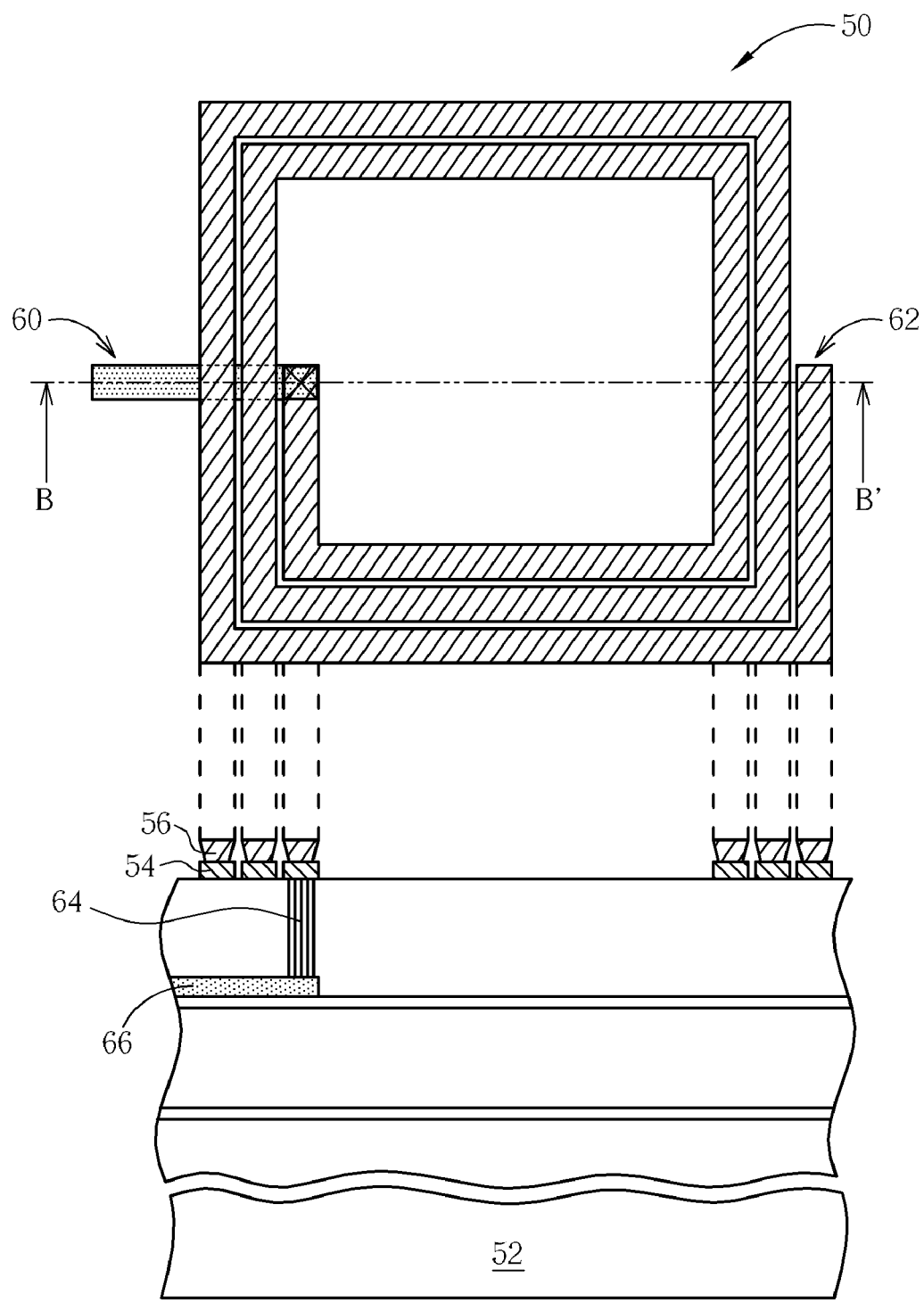
FIG. 2 illustrates another embodiment of the integrated inductor according to the present invention.

Please refer to FIG. 2. FIG. 2 is a diagram illustrating an integrated inductor 50 according to another embodiment of the present invention, wherein the diagram includes a top view and a cross-sectional view along a line BB'. The embodiment of FIG. 2 is similar to that of FIG. 1, and thus, the same components and their functions will not be described again hereinafter. Particularly in FIG. 2, there is no redistribution layer formed in the integrated inductor 50 as otherwise shown in FIG. 1. The integrated inductor 50 is then composed of a coil pattern including a top metal layer 54 comprising copper and a via layer 56 comprising aluminum. The layout of the via layer 56 of this embodiment is formed intentionally ignoring the general design rule; therefore, the via layer 56 has the same coil pattern as the top metal layer 54. The integrated inductor 50 may be viewed as a stack of two coil patterns comprising different metal materials. The effect of the circuit is equal to a parallel connection of two resistances and the parasitic resistance is reduced.

For convenience of illustration, the dielectric material among the metal layer pattern, the via layer pattern, and the redistribution layer pattern of the above-mentioned integrated inductor is not shown in the diagrams. In addition, the width of the coil, the number of turns of the coil, the shape of the coil, and the location of the two terminals may be adjusted as required and are not limited to the examples disclosed.

In comparison to the prior art, the integrated inductor as shown in the embodiments of the present invention comprises a stacked structure having a metal layer pattern, a via layer pattern, and a redistribution layer, and is fabricated by CMOS standard process or logic baseline process; therefore, the integrated inductor has a lower resistance and a higher Q factor. In addition, the present invention does not increase the cost of integrated inductor fabrication.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inductor formed in an integrated circuit, the inductor comprising:
 a metal layer pattern;
 a redistribution layer pattern formed above the metal layer pattern; the redistribution layer pattern residing in a redistribution layer comprising a part of at least a bond pad structure; and
 a via layer pattern formed between the metal layer pattern and the redistribution layer pattern, the via layer pattern electrically conductively contacting the metal layer pattern and the redistribution layer pattern;
 wherein the metal layer pattern, the via layer pattern and the redistribution layer pattern substantially overlap at different layers in a coil pattern.

2. The inductor of claim 1, wherein the metal layer pattern is a top metal layer.

3. The inductor of claim 1, wherein the metal layer pattern is a coil pattern, and the redistribution layer pattern is a coil pattern, the metal layer pattern substantially overlapping the redistribution layer pattern.

4. The inductor of claim 3, wherein the via layer pattern is a set of plural metal islands scattered between the metal layer pattern and the redistribution layer.

5. The inductor of claim 1, wherein the metal layer pattern comprises copper.

6. The inductor of claim 5, wherein the redistribution layer pattern and the via layer pattern comprise aluminum.

7. The inductor of claim 1, wherein the metal layer pattern, the redistribution layer pattern, and the via layer pattern provide a substantial inductance.

8. The inductor of claim 1, wherein the inductor is fabricated with a 0.13 μm process or a more advanced process.

9. The inductor of claim 8, wherein the metal layer has a thickness of approximately 10 k Å or less, the redistribution layer has a thickness of approximately 13 k Å or less, and the via layer has a thickness of approximately 12 k Å or less.

10. An inductor formed in an integrated circuit, the inductor comprising:
 a substrate;
 a first metal pattern formed above the substrate; and a second metal pattern formed above the first metal pattern and electrically conductively contacting the first metal pattern, wherein second metal pattern includes a via layer pattern and a redistribution layer pattern, the redistribution layer pattern residing in a redistribution layer comprising a part of at least a bond pad structure;

wherein the inductor provides a substantial inductance, and the first metal pattern and the second metal pattern are made of different metal materials.

11. The inductor of claim 10, wherein the first metal pattern comprises copper.

12. The inductor of claim 11, wherein the second metal pattern comprises aluminum.

13. The inductor of claim 10, wherein the first metal pattern is a coil pattern, and the second metal pattern is a coil pattern, the first metal pattern substantially overlapping the second metal pattern.

14. The inductor of claim 10, wherein the inductor is fabricated with a CMOS standard process.

15. The inductor of claim 14, wherein the first metal pattern includes a top metal layer formed by a CMOS standard process.

16. The inductor of claim 15, wherein the CMOS standard process is a 0.13 μm process or a more advanced process.

17. The inductor of claim 10, wherein the first metal pattern has a thickness of approximately 10 k Å or less, the redistribution layer has a thickness of approximately 13 k Å or less, and the via layer has a thickness of approximately 12 k Å or less.

18. A semiconductor element formed in an integrated circuit comprising a metal layer and at least one bond pad, the semiconductor element comprising:

a metal layer pattern formed in the metal layer;

a redistribution layer pattern formed above the metal layer pattern, the redistribution layer pattern residing in a redistribution layer comprising at least one part of the at least a bond pad; and an interconnect layer pattern formed between the metal layer and the redistribution layer, the interconnect layer electrically conductively contacting the metal layer pattern and the redistribution layer pattern.

19. The semiconductor element of claim 18 comprising an inductor.

20. The semiconductor element of claim 18, wherein the metal layer pattern and the redistribution layer pattern substantially overlap at different layers.

21. The semiconductor element of claim 18, wherein the metal layer is a top metal layer.

22. The semiconductor element of claim 18, wherein the metal layer pattern, the redistribution layer pattern, and the interconnect layer pattern provide a substantial inductance.

23. The semiconductor element of claim 18, wherein the redistribution layer pattern is a coil pattern.

24. The semiconductor element of claim 18, wherein the redistribution layer pattern comprises copper.

25. The semiconductor element of claim 18, wherein the redistribution layer pattern comprises aluminum.

26. The semiconductor element of claim 18, wherein the metal layer formed by a CMOS standard process.

27. The semiconductor element of claim 18, wherein the semiconductor element is fabricated with a 0.13 μm process or a more advanced process.

28. The semiconductor element of claim 18, wherein the interconnect layer pattern comprises a via layer pattern.

29. A semiconductor element formed in an integrated circuit comprising a metal layer and at least one bond pad, the semiconductor element comprising:

a first metal pattern formed in the metal layer; and a second metal pattern formed above the metal layer and electrically conductively contacting the first metal pattern, wherein the second metal pattern includes an interconnect pattern residing in an interconnect layer comprising a first part of the at least one bond pad.

30. The semiconductor element of claim 29, wherein the second metal pattern includes a redistribution pattern residing in a redistribution layer comprising a second part of the at least one bond pad.

31. The semiconductor element of claim 29, wherein the redistribution layer pattern comprises copper.

32. The semiconductor element of claim 29, wherein the redistribution layer pattern comprises aluminum.

33. The semiconductor element of claim 29, wherein the first metal pattern substantially overlapping the second metal pattern.

34. The semiconductor element of claim 29, wherein the semiconductor element is fabricated with a CMOS standard process.

35. The semiconductor element of claim 29, wherein the metal layer comprises a top metal layer.

36. The semiconductor element of claim 29, wherein the CMOS standard process is a 0.13 μm process or a more advanced process.

37. The semiconductor element of claim 29 comprising an inductor.

* * * * *